United States Patent [19]
Kobayashi

[11] Patent Number: 5,866,850
[45] Date of Patent: Feb. 2, 1999

[54] LAYERED CONSTRUCTION OF BUSBARS AND INSULATING PLATES WITH RIBS

[75] Inventor: Makoto Kobayashi, Yokkaichi, Japan

[73] Assignee: Sumitomo Wiring Systems, Ltd., Japan

[21] Appl. No.: 869,097

[22] Filed: Jun. 4, 1997

Related U.S. Application Data

[63] Continuation of Ser. No. 652,347, May 23, 1996, abandoned.

[30] Foreign Application Priority Data

May 23, 1995 [JP] Japan .................................. 7-124001

[51] Int. Cl.⁶ ..................................................... H02G 3/00
[52] U.S. Cl. ......................... 174/98; 174/70 B; 174/99 R
[58] Field of Search ....................... 174/113 AS, 117 AS, 174/70 B, 71 B, 72 B, 99 B, 96, 68.2, 138 E, 49, 97, 98, 99 R

[56] References Cited

U.S. PATENT DOCUMENTS

| | | | |
|---|---|---|---|
| 266,677 | 10/1882 | Corbett | 174/97 |
| 514,827 | 2/1894 | Hampton | 191/23 R |
| 2,230,423 | 2/1941 | Bassette | 174/72 B |
| 2,733,289 | 1/1956 | Warren et al. | 174/99 B |
| 2,968,781 | 1/1961 | Staskowski | 439/114 |
| 3,213,300 | 10/1965 | Davis | 307/147 |
| 3,219,887 | 11/1965 | Gerg et al. | 361/675 |
| 3,622,687 | 11/1971 | Doughty | 174/97 |
| 4,236,606 | 12/1980 | Niwa et al. | 188/381 |
| 5,284,548 | 2/1994 | Carey et al. | 216/18 |

FOREIGN PATENT DOCUMENTS

| | | |
|---|---|---|
| 0624904 | 11/1994 | European Pat. Off. . |
| 60-24644 | 6/1985 | Japan . |
| 63-120522 | 8/1988 | Japan . |
| 406113428 | 4/1994 | Japan ................ 174/70 B |
| 1591114 | 9/1990 | U.S.S.R. ............. 174/99 B |
| 2115213 | 9/1983 | United Kingdom . |
| 2 129 222 | 5/1984 | United Kingdom . |
| WO 8802943 | 4/1988 | United Kingdom . |

OTHER PUBLICATIONS

English translation of Soviet patent SU 1591114 A1, Inventor: Bichuch et al., Sep. 1990.

*Primary Examiner*—Kristine Kincaid
*Assistant Examiner*—Kamand Cuneo
*Attorney, Agent, or Firm*—Jordan B. Bierman; Bierman, Muserlian and Lucas

[57] ABSTRACT

A layered construction of busbars and insulating plates wherein the lower surfaces of the busbars on the lower surface of the upper insulating plate are opposed to and spaced apart from the upper surfaces of the busbars on the upper surface of the lower insulating plate by a specified distance T. Clearance providing ribs project from the lower surface of the upper insulating plate and the upper surface of the lower insulating plate and are in contact with the surfaces of the busbars.

6 Claims, 4 Drawing Sheets

LAYERED CONSTRUCTION OF BUSBARS AND INSULATING PLATES WITH RIBS

This application is a continuation of application Ser. No. 08/652,347, filed May 23, 1996, now abandoned.

This Application claims the benefit of the priority of Japanese 7-124001, filed May 23, 1995.

The present Invention relates to a layered construction comprising busbars and insulating plates, which are to be accommodated in an electrical connection box.

BACKGROUND OF THE INVENTION

An electrical connection box used to connect wiring harnesses of an automotive vehicle is, as shown in FIG. 3, provided with upper casing 1 and lower casing 2. Layered element 10, including busbars 3 to 6 for forming an internal circuit, and insulating plates 7 to 9, is accommodated in a space defined by casings 1 and 2. Busbars 3 to 6 are connected via connectors 13 to relays 11 and fuses 12 mounted in receptacles formed on the upper surface of upper casing 1.

As shown in detail in FIG. 4, in layered element 10, first tier busbars 3 are arranged on the upper surface of upper insulating plate 7, second tier busbars 4 are located on the upper surface of intermediate insulating plate 8, third tier busbars 5 are on the upper surface of lower insulating plate 9, and fourth tier busbars 6 are on the lower surface of lower insulating plate 9.

The lower surface of upper insulating plate 7 and the lower surface of intermediate insulating plate 8 are in contact with the upper surfaces of ribs 8a in intermediate insulating plate 8 and the upper surfaces of ribs 9a in the lower insulating plate 9, respectively. Further, the lower surface of upper insulating plate 7 and the lower surface of intermediate plate 8 are substantially in contact with the upper surfaces of second tier busbars 4 and the upper surfaces of third tier busbars 5, respectively.

However, the layered element 10 requires three insulating plates 7 to 9 to arrange four layers of busbars 3 to 6. This leads to an increased number of parts, increased weight of the electrical connection box, and consequently to increased production cost for layered element 10.

SUMMARY OF THE INVENTION

In order to solve the above problem, an object of the present Invention is to provide a layered construction of busbars and insulating plates which can be produced at a reduced cost by reducing the number of insulating plates, thus reducing the weight of the electrical connection box.

DETAILED DESCRIPTION OF THE INVENTION

According to the Invention, there is provided a layered construction to be accommodated in an electrical connection box. The construction comprises at least two insulating plates which locate at least two adjacent busbar layers between opposing surfaces thereof. Each layer comprises at least one busbar and includes spacers which are integrally formed with at least one of the insulating plates. This provides spacing areas by separating the opposing surfaces by a distance, in a direction substantially normal to the plane of the insulating plate, which is preferably greater than the total of the combined thicknesses of the two busbar layers. More preferably, the distance between the insulating plates is greater than the total thickness of three layers of adjacent busbars.

In a modification of the Invention, at least one spacing area contains a rib having a stepped portion, wherein the stepped portion supports a busbar of an intermediate layer. Advantageously, within the spacing area, the lower surfaces of busbars in the layer on the lower surface of the upper insulating plate are opposed to—and spaced apart from—the upper surfaces of the busbars in the layer on the upper surface of the lower insulating plate.

Desirably, the spacers comprise a set of ribs, which project from the lower surface of the upper insulating plate, and another set of ribs projecting from the upper surface of the lower insulating plate in the opposing direction. Preferably, each set of ribs is in contact with opposite busbars, thereby providing the aforementioned spacing areas therebetween. More preferably, the spacers are on each surface of adjacent insulating plates, thereby permitting the presence of more than two insulating plates and more than three layers of busbars. In a further modification, a busbar layer, having at least one busbar, is on a surface of an outer insulating plate which does not face an adjacent insulating plate.

Advantageously, busbars are secured to the upper and lower surfaces of each insulating plate, each plate having at least one through-hole through which a fixing rib projecting from a corresponding adjacent insulating plate is insertable. In this form of the Invention, the busbars are secured to the corresponding insulating plates by deforming the leading ends of the fixing ribs so that the ends are larger than the through-hole.

In a particularly useful embodiment of the Invention, there is provided a layered construction of busbars and insulating plates in a connection box, wherein the lower surface of a busbar on the under surface of the upper insulating plate is opposed to—and spaced apart from—the upper surface of a busbar on the upper surface of the lower insulating plate without an insulating plate therebetween. The ribs projecting from the lower surface of the upper insulating plate and the upper surface of the lower insulating plate are in contact with the opposite busbars or the opposite surface of the adjacent insulating plate. Accordingly, the respective busbars can be retained, spaced apart from each other, and the insulating plate between the second and third busbars in the prior art layered construction can be omitted. If the insulating plates and busbar layers are alternately arranged from the bottommost layer, the insulating plates and the busbars are not required to the secured to each other. However, in such a case, the busbars on the lower surface of the bottommost insulating plate can be held by the lower casing.

If the busbars are secured (for example, in the foregoing manner) on the upper and lower surfaces of the insulating plates in advance, it is not necessary to retain the busbars which are on the lower surface of the upper insulating plate by the ribs projecting from the lower insulating plate. Accordingly, the busbars can be more securely held in their specified positions.

In the accompanying drawings, constituting a part hereof, and in which like reference characters indicate like parts, FIG. 1(A) is a section of a layered element of busbars and insulating plates according to a first embodiment of the Invention;

Figure 1A:
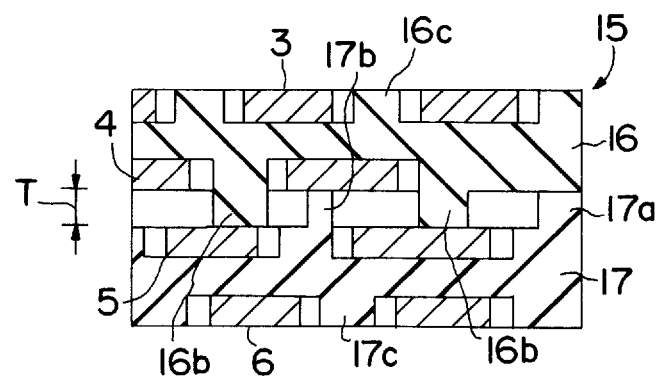
FIG. 1(B) is a section of a layered element of busbars and insulating plates according to a second embodiment of the Invention.
Figure 1B:
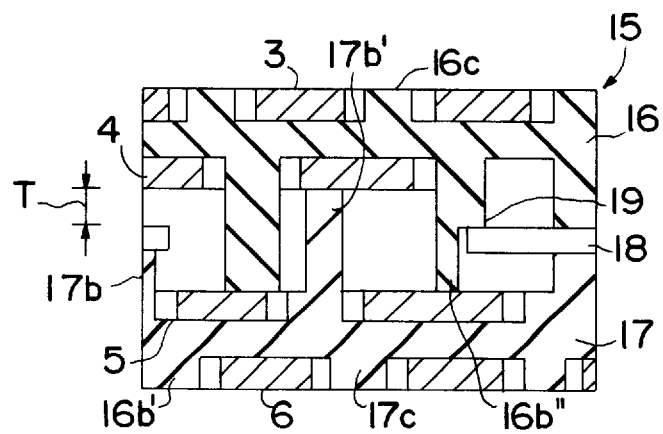
Figure 2A:
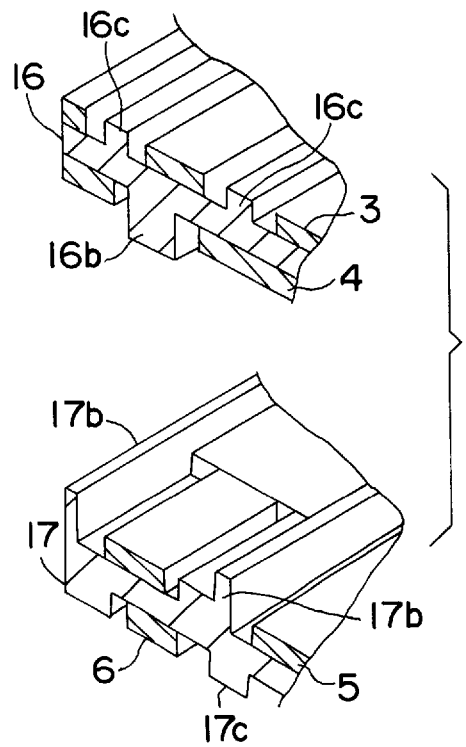
FIG. 2(A) is an exploded partial perspective view of the layered element of FIG. 1(A)

As shown in FIGS. 1 and 2, layered element 15 comprises first tier of busbars 3 and second tier of busbars 4 on the upper and lower surfaces, respectively, of upper insulating plate 16, and third tier busbars 5 and fourth tier busbars 6 are on the upper and lower surfaces of lower insulating plate 17, respectively.

Figure 4:
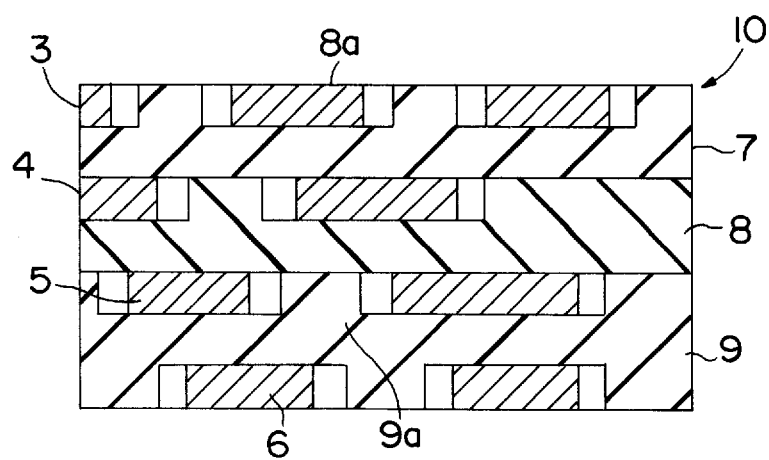
FIG. 4 is a view, similar to that of FIG. 1, of the prior art layered element.

Busbars 3, 4, 5, and 6 are on different planes, which are substantially parallel to the insulating plates. The lower surfaces of busbars 4 are opposed to—and spaced apart from—busbars 5 by a specified distance T. The spacing T corresponds to the thickness of intermediate insulating plate 8 of the prior art as shown in FIG. 4.

Ribs 16b project toward the upper surface of lower insulating plate 17 and are integrally or unitarily formed on the lower surface of upper insulating plate 16. Ribs 16b are in contact with the upper surfaces of busbars 5 on the upper surface of lower insulating plate 17. Analogously, ribs 17a and 17b project toward the lower surface of upper insulating plate 16 and are unitarily formed on the upper surface of lower insulating plate 17. Rib 17a is in contact with the lower surface of upper insulating plate 16, whereas rib 17b is in contact with the lower surface of busbar 4. Ribs 16c define spaces for locating busbars 3 and are unitarily formed on the upper surface of upper insulating plate 16. Further, ribs 17c which define spaces for busbars 6, are similarly unitarily formed on the lower surface of lower insulating plate 17.

Figure 2B:
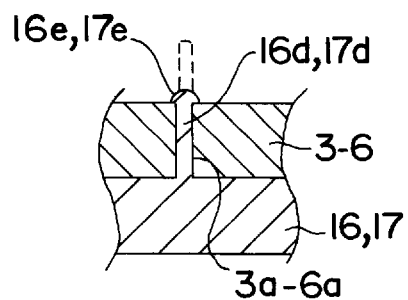
FIG. 2(B) is a partial section showing a fixing rib.
Figure 3:
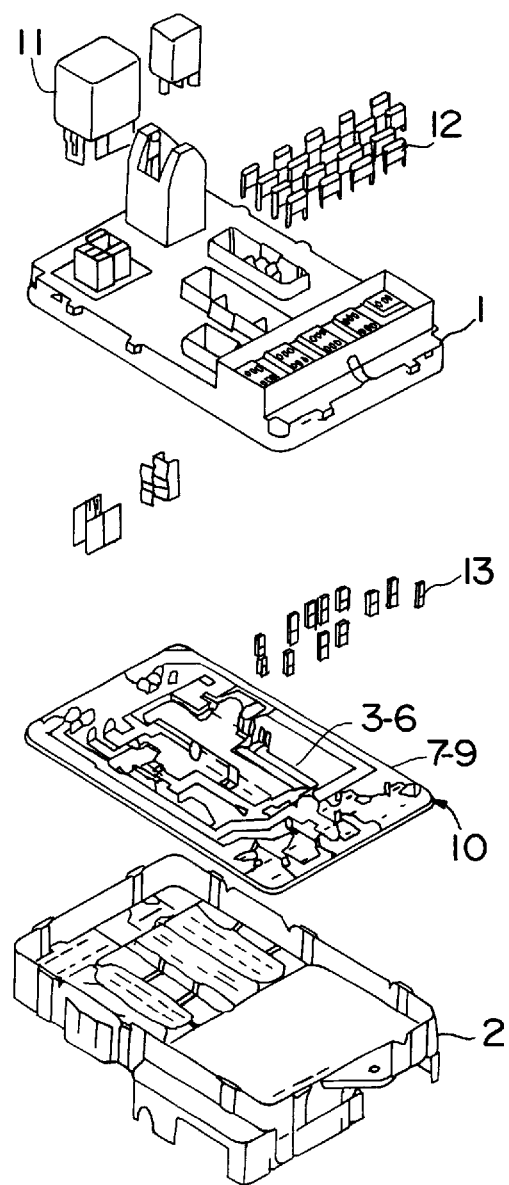
FIG. 3 is an exploded perspective of an electrical connection box of the prior art.

Busbars 3 to 6 on the upper and lower surfaces of respective plates 16 and 17 include narrow through-holes 3a to 6a as shown in detail in FIG. 2(B). Narrow fixing ribs 16d and 17d, projecting from the upper and lower surfaces of insulating plates 16 and 17, are inserted through through-holes 3a to 6a. The leading ends of fixing ribs 16d and 17d are deformed by, e.g. the application of heat to melt them so that head portions 16e and 17e are larger than through-holes 3a to 7a. In this way, busbars 3 to 6 are secured on and to insulating plates 16 and 17.

The insulating plates and busbars thus fabricated are assembled as follows. Busbars 3 to 6 are secured on the upper and lower surfaces of insulating plates 16 and 17 in advance. Thereafter, upper insulating plate 16 is placed over lower insulating plate 17, bringing the lower surface of upper insulating plate 16 into contact with the upper surface of rib 17a. Ribs 16b of upper insulating plate 16 are in contact with the upper surfaces of busbars 5 on lower insulating plate 17, and rib 17b is substantially in contact with the lower surface of busbar 4 on upper insulating plate 16. As a result, busbars 4 and 5 are held between upper and lower insulating plates 16 and 17, spaced apart by distance T, i.e. electrically insulated. Accordingly, insulating plate 8 disposed between busbars 4 and 5 of the prior art shown in FIG. 4 is eliminated. In other words, only two insulating plates 16 and 17 are required for four layers of busbars 3 to 6, i.e. the number of insulating plates can be reduced.

If N denotes the number of layers of busbars, and I denotes the number of insulating plates, the equations I=N−1 and I=N/2 can be established for the prior art and the first embodiment of the Invention, respectively. For example, if there are 10 layers of busbars, 9 insulating plates are necessary for the prior art. However, according to the first embodiment of the Invention, it is sufficient to have only 5 insulating plates, i.e. the number of insulating plates can be reduced by 4.

The Invention is not limited to the foregoing embodiment. The busbars and the insulating plates are not necessarily secured to each other. The insulating plates and the layers of busbars may be alternately arranged from the bottommost layer. Further, even if the busbars and the insulating plates are secured to each other, the Invention is not limited to the securing devices described herein.

A second embodiment according to the Invention is shown in FIG. 1(B). There are three tiers of busbars 4, 5, and 18 between two insulating plates 16 and 17. Upper insulating plate 16 includes ribs 16b' and 16b" and lower insulating plate 17 carries ribs 17b'. Ribs 16b' and 16b" project from the lower surface of upper insulating plate 16 toward lower insulating plate 17 and support busbar 5 on the upper surface of lower insulating plate 17. Rib 16" comprises shoulder 19 preferably approximately half way between upper and lower insulating plates 16 and 17. Busbar 18 is at stepped portion 19 and is supported on one side thereby. Busbars 3–6 are supported in their plane in a manner similar to that of the first embodiment. Thus, they can be supported by interaction with ribs 16b', 16b", and 17b' only, or by means of additional holding elements such as ribs 16d and 17d.

In this embodiment, if N denotes the number of layers of busbars, and I denotes the number of insulating plates, the equations can be established for the prior art and the second embodiment of the Invention, respectively. For example, in the case of 11 layers of busbars, 10 insulating plates are necessary for the prior art. However, according to the second embodiment of the Invention, four insulating plates are sufficient, i.e. the number of insulating plates can be reduced by six. Thus, this embodiment permits the number of insulating plates to be further reduced, leading to an even smaller number of components and simpler construction than the first embodiment of the Invention.

Although only a specific number of embodiments of the present Invention have been expressly disclosed, it is, nonetheless, to be broadly construed and not to be limited except by the character of the claims appended hereto.

I claim:

1. A layered construction comprising at least a first generally planar insulating plate and a second generally planar insulating plate, at least one first groove in said first plate and at least one second groove in said second plate, each of said first groove and said second groove having two spaced apart sides substantially perpendicular to said first plate and said second plate, respectively, said two spaced apart sides of said first groove and said first plate being in one piece, said two spaced apart sides of said second groove and said second plate being in one piece, a bottom in each of said first groove and said second groove between said two sides, a first space between said bottom of said first groove and said second plate, a second space between said bottom of said second groove and said first plate, a first busbar layer, having at least one first flat busbar and, adjacent thereto, a second busbar layer having at least one second flat busbar, said first busbar being in said first groove and said second busbar being in said second groove, said first space having a greater vertical dimension than said first busbar, and said second space having a greater vertical dimension than said second busbar, at least one first rib on said first plate extending toward and in contact with said second busbar, at least one second rib on said second plate extending toward and in contact with said first busbar.

2. The layered construction of claim 1 wherein said first busbar layer is on an under surface of said first plate and said second busbar layer is on an upper surface of said second plate, a lower surface of said first busbar in said first layer is opposed to, and spaced apart from, an upper surface of said second busbar in said second layer.

3. The layered construction of claim 1 wherein there is a third busbar layer having at least one busbar on an outer surface of said first plate, said second plate, or both.

4. The layered construction of claim 1 wherein said first busbar is secured to a surface of said first plate, or said second busbar is secured to a surface of said second plate or both.

5. The construction of claim 1 wherein said first busbar has a first width and said second busbar has a second width, said first groove having a first distance between its said two spaced apart sides and said second groove having a second distance between its said two spaced apart sides, said first width being substantially the same as said first distance and said second width being substantially the same as said second distance.

6. The layered construction of claim 1 wherein there is at least a third generally planar insulating plate, there being a space between each pair of adjacent ones of said first, second, and third insulating plates.

* * * * *